United States Patent [19]

Micheron et al.

[11] Patent Number: 4,734,228

[45] Date of Patent: Mar. 29, 1988

[54] PROCESS AND DEVICE FOR PREPARING A PIEZOELECTRIC MATERIAL

[75] Inventors: François Micheron; Jean P. Le Pesant, both of Gif sur Yvette, France

[73] Assignee: Thomson-CSF, Paris, France

[21] Appl. No.: 873,892

[22] Filed: Jun. 13, 1986

[30] Foreign Application Priority Data

Jun. 14, 1985 [FR] France .................... 85 09072

[51] Int. Cl.⁴ .................................. B29C 71/04
[52] U.S. Cl. ............................ 264/22; 29/25.35; 361/228; 264/10; 264/24; 264/27; 264/81; 264/83; 264/104; 264/235; 425/135; 425/166; 425/174.6; 425/174.8 R; 425/174.8 E
[58] Field of Search ............. 264/22, 10, 25, 81–83, 264/24, 27, 40.1, 104, 235; 425/174.6, 135, 166, 174.8 R, 174.8 E; 29/25.35; 361/228

[56] References Cited

U.S. PATENT DOCUMENTS

| | | | |
|---|---|---|---|
| 3,081,485 | 3/1963 | Steigerwald | 264/24 |
| 3,644,605 | 2/1972 | Sessler et al. | 264/22 |
| 3,900,538 | 8/1975 | Kawakami et al. | 264/80 |
| 4,158,847 | 6/1979 | Heinzi et al. | 346/140 PD |
| 4,345,359 | 8/1982 | Micheron | 264/22 |
| 4,384,394 | 5/1983 | Lemonon et al. | 264/22 |
| 4,500,377 | 2/1985 | Broossoux et al. | 264/22 |
| 4,517,143 | 5/1985 | Kisler | 264/22 |
| 4,521,445 | 6/1985 | Nablo et al. | 264/22 |
| 4,565,615 | 1/1986 | Radice | 264/22 |
| 4,588,537 | 5/1986 | Klaase et al. | 264/22 |

FOREIGN PATENT DOCUMENTS

3406125  8/1985  Fed. Rep. of Germany ........ 264/25

*Primary Examiner*—Jeffery Thurlow
*Attorney, Agent, or Firm*—Pollock, VandeSande & Priddy

[57] ABSTRACT

According to the invention, the dipolar orientation of an object made of material adapted to present piezoelectric properties is obtained by exposing at least one of the faces of the object to a jet of charged microparticles in order to create therein a sufficient electrical field to obtain the said orientation, and in a variant of the invention, a direct polarization is carried out by displacing a film in front of at least one generator of charged microparticles, this invention applying in particular to the production of film in a piezoelectric polymer or copolymer.

17 Claims, 6 Drawing Figures

FIG_1
PRIOR ART

FIG_2

FIG_5

FIG_6

PROCESS AND DEVICE FOR PREPARING A PIEZOELECTRIC MATERIAL

BACKGROUND OF THE INVENTION

1. Field of the Invention

The present invention concerns the preparation of a material having piezoelectric properties through dipole orientation of a poled dielectric, and in particular the preparation of a piezoelectric polymer, as well as a device for carrying out such process.

2. Description of the Prior Art

Numerous materials of various types present piezoelectric properties or are adaptable to present such effects after being subject to appropriate processing. Polarized ferro-electric ceramics or monocrystalline quartz, for example, may be cited. More recently, piezoelectric polymers have been introduced. These piezoelectric polymers are generally used in the form of planar films metallized on tow faces, the film may be mechanically oriented, and in any event the film is polarized by applying an intense electric field (of about 1 MV/cm) at a temperature equal to or higher than ambient temperature. As a result of this processing, the polymer films acquire pyroelectric and piezoelectric properties allowing them to be used as transducers. These planar films can be used in the following applications: pressure sensors, displacement sensors (microphone, stress gauge, etc...) and temperature sensors (pyroelectric sensor for intrusion detection, for infra-red photography). It has been proposed to use these materials, after heat forming or molding into suitable forms, in order to produce earphone, loudspeaker or microphone membranes. Such transducer devices are described, for example, in U.S. Pat. No. 4,384,394.

Among polymers which may be used for such purposes are by way of example, vinylidene polyfluoride (PFV$_2$), vinyl polychloride (PVC), vinyl polyfluoride (PVF) and copolymers, such as poly (tetrafluoride/ethylene P:(TrFE-VF$_3$) vinylidene fluoride: P(TFE-VF$_2$) and poly (trifluoroethylene-vinylidene fluoride.

The dipole orientation in the materials, induced by use of an electric voltage generator, induces stable piezoelectric and pyroelectric properties at least in the temperature range lower than their Curie temperatures. This orientation requires the use of intense electric fields such as indicated hereinabove, such fields being themselves of the same value as the breakdown field. This means that there is a high probability of breakdown during polarization, thereby leading to short-circuiting of the voltage generator, when said generator is applied between electrodes deposited on the dielectric. In order to overcome this drawback, it has been proposed in the prior art to use gaseous electrodes, such as air ionized by a needle.

If the dielectric breaks down locally, which event is characterized by a conductive path between its two faces, the generator is not short-circuited due to the high impedance of the plasma and thus the areas outside the short-circuited zone remain subjected to the electrid field.

However, this method presents several drawbacks.

The surface voltage obviously cannot exceed the potential of the needle, thereby limiting the dielectric thicknesses to be polarized. It is in fact difficult, due to hydrodynamic instabilities that appear in the plasma, to exceed needle voltages beyond about 20 killovolts. If the polarization field necessary for a given dielectric is for example 1 MV/cm, the maximum thickness that can be polarized is 200 micrometers.

The plasma created by a needle contains a very wide spectrum of charged bodies; electrons, ions, complexes, and neutral nitrogen, which are generally very reactive. The first consequence is that the field in the plasma can confer upon certain of the charged bodies sufficient energy for them to be implanted in the dielectric. This dielectric therefore acquires an excess charge (electret state); said excess charge impairs the dipole orientation since the associated field of charged bodies tends to break the regularity of the polarization field and thus generates a non-uniform remnant polarization in the thickness of the dielectric. The second consequence is that the reactivity of the plasma causes erosion of the surface of the dielectric; oxidation, ruptures of the macromolecular chains with or without cross-linking, and such chemical erosion then can impair the dielectric's stability, especially when it is relatively thin.

The present invention is aimed at overcoming the drawbacks of the processes of the prior art recalled hereinabove.

In the process according to the invention, a dipole polarization is carried out by a charged jet of small liquid drops or droplets. This process, while eliminating the drawbacks set out hereinabove, presents the supplementary advantage of simultaneously performing an electrode deposit on the material. In a supplementary alternative embodiment of the invention, the process allows the continuous polarization of the material which is used in the form of a strip or film.

The object of the invention is thus to provide a process for preparing a material having piezoelectric properties as a result of a dipolar orientation of a poled dielectric material, which material acquires the said piezoelectric properties when subjected to an electric field of determined amplitude. The electric field is created between two superficial zones of an object brought to different electrical potentials. The process comprises the steps of exposing at least one of the said superficial zones to an electrically charged jet of droplets, the exposure time is selected so that the charged droplets are accumulated on each exposed superficial zone thus increasing the potential difference between the superficial zones up to the determined electric field amplitude.

A further object of the invention is to provide a device for carrying out the said process.

BRIEF DESCRIPTION OF THE DRAWINGS

The invention will become more apparent and other features, advantages and objects will appear from the following description given with reference to the appended drawings in which.

DETAILED DESCRIPTION OF THE DRAWINGS

Figure 1:
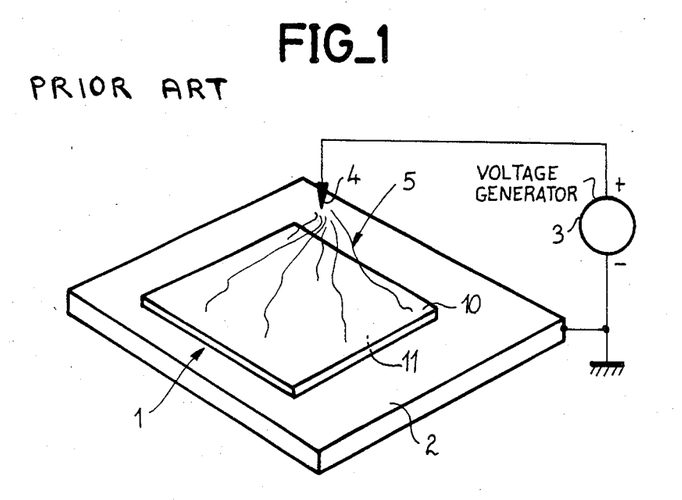
FIG. 1 illustrates a process according to the prior art.

FIG. 1 illustrates schematically a dipolar orientation device for a polymer material according to one of the methods used according to the prior art. A film 1 of this material is disposed on a plate 2 made of electrically conductive material. This is electrically connected to the negative terminal of a high-voltage direct current generator 3. The assembly is connected to earth potential (ground). The positive terminal of the generator 3 is connected to a needle 4. Due to the strong electric field created between the plate 2 at earth potential and the needle 4, the air 5 comprised between these two elements is ionized. A gaseous electrode is thus formed in contact with the upper main face 10 of film 1. This is therefore sandwiched between two electrodes; a gaseous electrode in contact with the upper main face 10 and a planar metallic electrode in contact with the lower main face 11.

The generator 3 should supply a voltage that normally cannot exceed about 20 kilovolts. For a film 1 having a typical thickness equal to 200 micrometers, the electric field thus reaches an amplitude of about 1 MV/cm. This value is sufficiently high to obtain a polarization of the material and induce piezoelectric properties.

Although use of a gaseous electrode presents advantages with respect to the more conventional methods of disposing the material to be polarized between two solid electrodes, this process is nevertheless not entirely free of drawbacks.

These drawbacks, as mentioned above, are principally the following:
- limitation of the thickness of the films since the needle potential is limited to a typical value of 20 kV; and
- implantation of the charged bodies in the material which generates a remnant polarization.

The object of the present invention is a process to overcome these drawbacks. According to the invention, the dipolar polarization of the material is obtained by using a charged jet of droplets.

The principle physical phenomena involved in this technique will first of all be set out.

A jet of droplets, considered in a first approximation as spherical with radius R is brought to potential V equal to that of a nozzle which projects the droplets. These charged droplets being considered as isolated in sapce, each bears a charge equal to the relation:

$$Q = 4\pi\epsilon_o RV \quad (1)$$

$\epsilon_o$ being the permittivity.

If a number N of droplets is ejected in a time period t, the current generated by the jet equals the relation:

$$i = (N/t)Q \quad (2)$$

Assuming the following values: R=1 micrometer; V=1 kV and N/T=$10^8$/second, the electric current is about 10 microamperes, the volume corresponding to $10^8$ charged microparticles is equal to 0.1 mm$^3$ and the surface covered for a thickness of 1 micrometer is equal to 1 cm$^2$.

The charged jet of droplets thus behaves like a constant current source, able to raise surface potential of a dielectric, and thus to induce at the core the dipolar orientation. In fact, the surface of the dielectric can reach a potential much higher than the potential of the nozzle emitting the droplets. This potential reaches a maximal saturation value when the electrostatic repulsion exerted by the dielectric upon the charged droplets becomes equal to the kinetic energy of these charged droplets. The kinetic energy of the charged droplets is proportional to the square of their velocity the electrostatic energy of the system dielectric plus charged droplets is proportional to the square of the potential, the latter is in first approximation a linear function of the velocity of the charged droplets.

Figure 2:
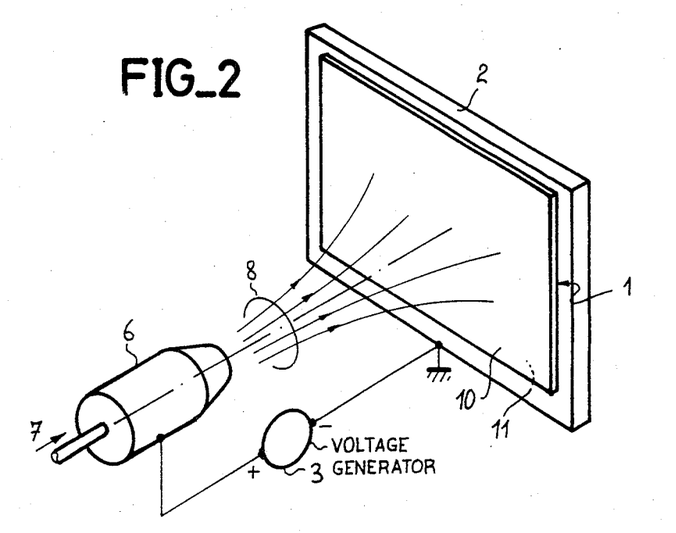
FIG. 2 illustrates the process according to the invention.

FIG. 2 schematically represents a device for carrying out the process according to the invention.

The device comprises a planar electrically conductive support 2 against which is disposed a film of material 1 to be polarized. The material 1 is thus in contact by one of its main faces, i.e. the rear face 11 in FIG. 2, with the support 2 that acts as a counter-electrode. As in the case of devices according to the prior art, the support 2 is connected to one of the terminals, the negative terminal in FIG. 2, of a high-voltage direct current generator 3.

The other terminal of this generator is connected to a nozzle 6. This nozzle is supplied with a fluid 7 adapted to produce charged droplets 8 projected by the nozzle 6. These charged droplets are attracted by the conductive plane 1 and are progressively deposited on face 10, opposite the nozzle 6.

The process according to the inention was carried out under the following conditions:

Nozzle 6 was fed by a jet of humid air which was subjected to expansion. The high voltage applied to nozzle 6 resulted in the electrocrystallization of the water droplets, and thus produced a jet of charged droplets. A plate of ethylene trifluoro vinylidene polyfluoride P (VF$_2$/TrFE) at 70% of PVF$_2$ and 30% of TrFE, copolymer thickness 300 micrometers, metallized on a face in contact with a conductor plane at zero potential was placed at 50 cm from the mouth of the nozzle 6. The nozzle 6 was brought to a potential of 3 kV with respect to the potential of the mass (potential of the support 2). The charged jet of droplets was obtained from compressed air under a pressure of 5.10$^5$ Pa, with a relative humidity of 15%.

In 30 seconds, the dipolar orientation in the P(FV$_2$/TrFE) copolymer was achieved up to saturation, which means a longitudinal piezoelectric coefficient d$_{33}$=28 pCN$^{-1}$.

By way of comparison, the same piezoelectric saturation coefficient was obtained by polarization between electrodes, in an oil bath at ambient temperature according to one of the methods of the prior art. The required potential was 30 kV, which proves that the surface potential of the dielectric charges by the droplets had effectively reached this value, i.e. ten times the potential of the nozzle 6. Furthermore, the polarization value at saturation in the P(VF$_2$TrFE) copolymer was about 8×10$^6$C/cm$^2$, the polarized surface about 25 cm$^2$, the mean charge current was thus about 7 microamperes, i.e. consistent with the previously estimated value.

Devices for generating charged particles are commercially available. By way of example, the experimentation that is described hereinabove was performed by utilizing an INJECO® system manufactured by the comparny ECOPOL. This system is usually used to charge electrically insulated objects; THT Van de Graf type generators, charge simulation accumulated by airborne aircraft, etc.

According to a second variant of the invention, the process according to the invention is particularly well adapted to the continuous polarization of piezoelectric polymers, such as vinylidene polyfluoride (PFV$_2$) with for example trifluoroethylene (TrFE) or ethylene poly-tetrafluoride (PTFE) copolymers that are in the polar phase.

Figures 3, 4:
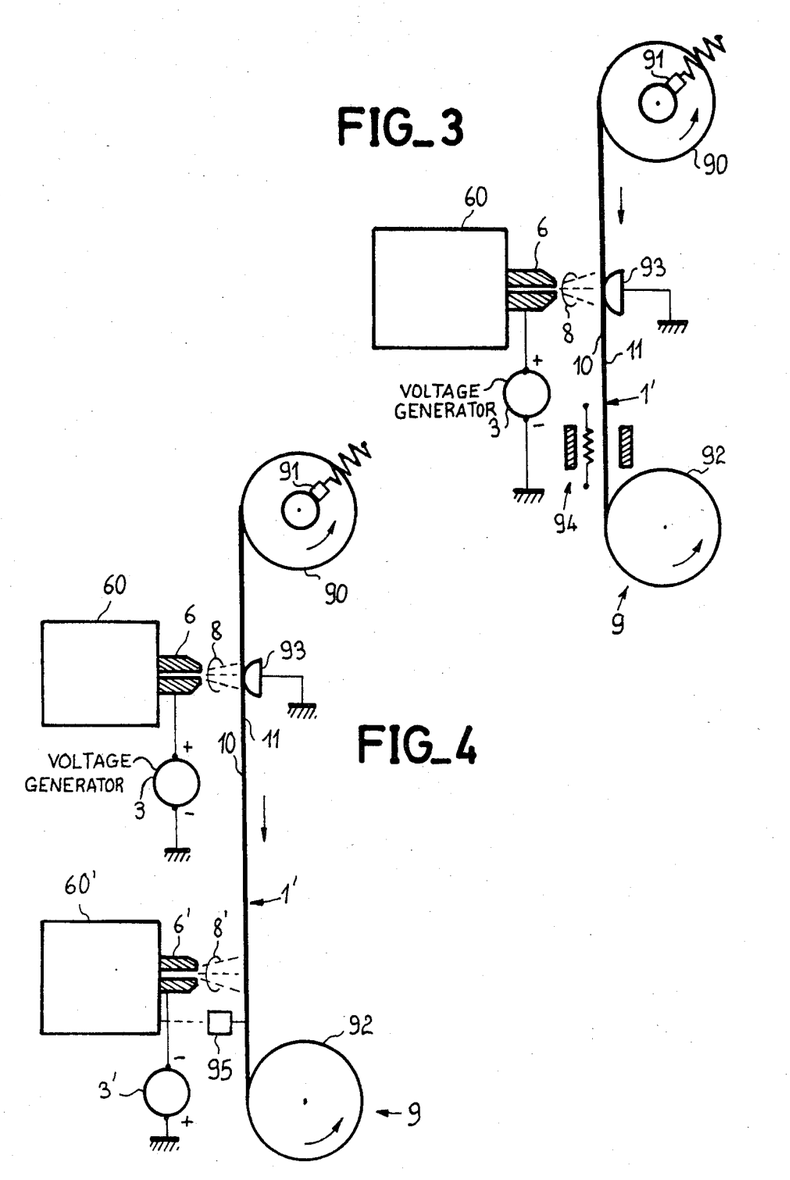
FIGS. 3 to 6 illustrate supplementary alternatives of the process according to the invention allowing continuous polarization.

FIG. 3 schematically illustrates a continuous polarization device for a film of polymer material for carrying out this alternative embodiment.

The device comprises as previously stated a generator 60 of charged droplets ejected by a nozzle 6 brought to a high potential due to a high-voltage D.C. generator 3.

More specifically, the device illustrated in FIG. 3 also comprises a winding-unwinding element 9 for the film or band of polymer material 1' to be polarized.

The band of polymer material 1' travels between an unwinding drum 90 and a winding drum 92 while bearing by its face 11 on a fixed skid or a free wheel at zero potential i.e. at the potential of the earth, designated by element 93. The nozzle 6 is placed at the level of this element 93 which acts as an electrode: thus the zone in contact with the electrode at zero potential is polarized. If the surface of the charged droplet jet 8 at the level of the film on face 10 is typically 30 cm wide (width of the film 1') over a length of 1 cm parallel to the direction of travel of the film and if it is taken into account that the polarization saturation is reached in several tens of seconds, the advance speed of the film must thus be fixed at several centimeters per minute. It is necessary to provide a film tension, i.e. that the unwinding coil must be braked. In fact, through electrostriction due to the polarization, the surface of the film increases by about 1% and the mechanical tension thus ensures it flatness. In practice, a tension of $10^6$ to $10^7$ $N/m^2$ is sufficient. A brake 91 acting on the unwinding drum 90 is represented schematically.

Once the dipolar orientation has been performed, it can become necessary to discharge the surface of the dielectric prior to winding.

According to a first alternative, film 1' can be heated by means of an oven or tunnel and the increase of the conductivity thus created can be used to obtain a natural discharge. A heating element has been schematically represented in FIG. 3 by a resistance 94. Usual temperatures are comprised between 80° and 100° C. resulting in discharge in several seconds. This operation furthermore presents the advantage of carrying out an annealing, i.e. increasing the orientation stability.

The discharge of the surface can also be carried out by means of a second injector of charges of opposite sign and at low current; this current can furthermore be servo-controlled in order that the surface potential be zero, the measuring of the surface potential being carried out by means of an electrostatic voltmeter.

FIG. 4 schematically represents such a device.

The elements identical to those represented in FIG. 3 bear the same references and will not be described again.

The device thus comprises, instead of and in the same place as the heating tunnel (FIG. 3: 94) a second injector 60' of charged droplets 8' comprising a nozzle 6' brought to a potential opposite to that of the nozzle 6. In the example illustrated, a high-voltage D.C. source 3' is used for this purpose. Optionally, an electrostatic voltmeter 95 measures the residual charge of the film 1' and is used to servo-control the quantity of charged droplets 8' generated or the potential of the nozzle 6' at a reference value. In this latter case, contrary to what has been illustrated in FIG. 4, the source 3' is controlled and thus forms an adjustable voltage source.

Naturally, these latter elements must be disposed downstream from the generator 60 of charged droplets 8 used for the polarization of film 1'.

Furthermore, it is possible to eliminate the contact surface at zero potential, element 93, and to replace it by a second injector, the charges of which have a sign opposite to those created by the first generator 60; film 1' is thus symmetrically polarized by two jets of charged droplets.

Figure 5:
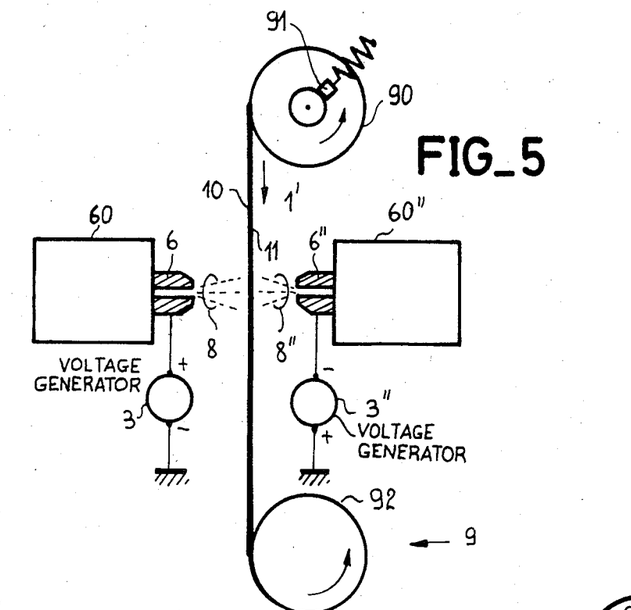

FIG. 5 illustrates a device for carrying out this alternative embodiment. The elements common to those represented in FIGS. 3 and 4 bear the same references and will not be described again.

According to this alternative embodiment, a second generator 60" of charge-bearing droplets 8" opposed to droplets 8 is used. To this end, the nozzle 6" of the second generator is connected to the negative terminal of a high-voltage D.C. source 3" the positive terminal of which is connected to the earth, the nozzle 6 being, in the example illustrated by FIG. 5, brought to a positive potential with respect to the earth. The two generators of droplets are disposed facing each other, opposite respective faces 10 and 11 of the film 1'.

Advantageously, in any one of the embodiments of the process according to the invention carried out, a metallic deposit or conductive material deposit may be applied onto at least one of the faces of the film to be polarized.

To achieve this conductive ink, droplets are used. By covering the surface of the film 1', the conductive ink droplets coat it with an electrode. This ink comprises a suspension liquid or volatile solvent which evaporates once the droplets have been deposited on the surface. Furthermore, the conducting layer must adhere to the surface of the polymer. A possible solution consists in a suspension of conductive particles such as carbon in a solution of the polymer to be coated. After the evaporation of the solvent, the concentration in conductive particles must reach at least 15% of the remaining deposited volume, in order to pass the percolation threshold of the conductivity in the electrode.

This feature is particularly interesting when the variant of the process according to the invention discussed in relation with FIG. 5 is carried out. In fact, in this case, it is possible to deposit, as described, an electrode on face 10 or 11 of the film 1' or on both the said faces.

Furthermore, by conveniently changing the nature of the charged droplets, it is possible to perform a selective deposit of conductive material on determined zones of the film, on any one of its faces or both, while continuously polarizing the film over its entire length.

It is of course also possible to polarize only certain parts of the film.

In the foregoing description (in connection with FIG. 2 et seq.), the charged jet of droplets is present in the form of an aerosol spray. According to a supplementary embodiment of the invention, this aerosol spray can be replaced by a directed jet of conductive droplets.

According to a known technique for ink jet printers, the liquid is made to vibrate at a determined frequency, either through the intermediary of the nozzle, or directly by a transducer.

For an ejection frequency of 200 KHz, at a velocity of 20 m/s the mean diameter of the drops obtained is about 100 micrometers. This jet of drops is charged by electric influence and thus can be directed when passing between electrodes at an appropriate potential: it requires a voltage of about 500 V to obtain a current of 10 microamperes. The advantage of the conductive droplet jet with respect to the aerosol spray is that the flow rate and the direction of such conductive jet can be very accurately controlled.

It thus becomes possible to paint the localized electrodes not only in the direction of travel, but also orthogonally to this direction. This is advantageous, for example, in devices using non-continuous electrodes, or when it is desired to leave non polarized and non conductive margins, or to avoid a defect, etc.

Figure 6:
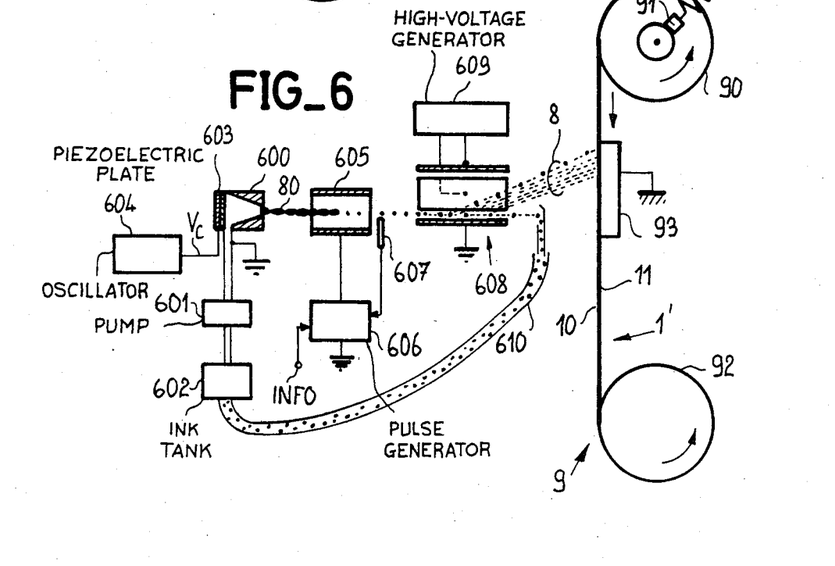

FIG. 6 illustrates a device of this type.

The elements for generating charged conductive ink droplets 8 comprise a nozzle 600 fed with conductive ink. To this end, a pump 601 is used. The ink issues from a tank 602. The bottom of the nozzle 600 is constituted by a piezoelectric crystal plaquette 603 excited by an oscillator 604, generating a control signal $V_c$ at the ejection frequency, for example 200 KHz. At the outlet of the nozzle 600, the ink jet 80 which is not yet divided into droplets passes through a hollow electrode 605 selectively brought to an average voltage (50 to 200 V) under the control of a generator 606 of average voltage pulses. The generator produces these pulses in response to INFO signals determining the sites of the band 1' of the material to be polarized.

The excitation frequency of the piezoelectric plaquette 604 determines the size of the desired droplets, as a function of a certain number of physical parameters such as the distance between the nozzle 600 and the electrode 605, their geometric characteristics, etc. It is this excitation which allows the jet to split up into droplets of regular diameter, at constant ejection frequency.

At the outlet of the electrode 605, the droplets ar electrically charged. A probe 607 detects the ejection of the charged droplets 8 and transmits pulse synchronization to the average voltage generator 606 signals, which synchronizes the generating of these impulses with the passage of the droplets through the hollow electrode 605.

The charged droplets thereafter pass through a deflection element comprising a set of electrodes 608 controlled in a manner known per se, by a steady high-voltage generator 609. The deflection is obtained by a variable level of charge of the drops.

At the outlet of the deflection element, the jet of charged droplets is directed towards a determined zone of the face 10 of the band 1' of material to be polarized.

The generator 606 can generate, for example, a scanning in one direction, of the television type. In this case, according to the time distribution of the INFO signals, preferably of the binary type, a zone corrsponding to a counter-electrode element 93, at earth potential will be selectively charged. It is thus possible to program any desired appropriate patterns including alphanumerical characters or more generally various coding elements.

The INFO signals can be supplied by a computer with recorded programs or any type of automatic or manual control circuit.

The speed of scanning is, of course, determined as a function of the charge to be reached in order to induce a sufficient electric field between the two faces 10 and 11 of the film 1'.

A supplementary element 610 intercepts the ink droplets not used and evacuates them towards the tank 602.

Of course, these features are compatible with all previously described embodiments, especially with the variant of the invention described in relation with FIG. 1. The film 1' is then replaced by a single foil or card 1.

The present invention is not limited to the polarization of a film made of polymer material, although obtaining such materials constitutes a preferred application of the process according to the invention. As indicated hereinabove, the process applies to numerous materials adapted to acquire piezoelectric properties when they are subjected to an intense electric field. These materials can have any form, but in practice, the materials to be polarized are most often used in the form of strips having parallel faces: foils, films or ribbons.

What is claimed is:

1. A process for preparing a product having piezoelectric properties as a result of dipolar orientation of an object made of polar dielectric material and adapted to acquire said piezoelectric properties when the object is subjected to an electrical field of determined amplitude in order to obtain the said dipolar orientation, the electrical field being generated between two surface zones of the object which are brought to different respective electric potentials, said process further comprising exposing at least one of the said surface zones to a jet of electrically charged droplets of a first polarity, selecting the duration of said exposure so that the charged droplets are accumulated on each exposed surface zone to increase the potential difference between said surface zones up to the said determined electrical field amplitude.

2. A process according to claim 1, wherein the object has the form of a film with two main faces and one of the main faces is exposed to the jet of charged droplets and the process includes the further step of contacting the other main face by a support made of electrically conductive material forming an electrode, this electrode being brought to a fixed potential so as to generate the said electrical field between the two main faces.

3. A process according to claim 1, wherein the said object has the form of a film with two faces and each of the faces thereof is exposed to a jet of charged droplets, the respective polarities of the charges conveyed by these charged droplets is opposite so as to generate the said electrical field between the two exposed faces.

4. A process according to claim 3, wherein each jet of charged droplets impacts only on a part of the total surface of the said film and the film is displaced in a determined direction so that each jet of charged droplets scans the entire surface of the film.

5. A process according to claim 4, wherein the charged droplets are conductive ink drops adapted to form a deposit of a layer of electrically conductive material constituting an electrode over at least part of the said film.

6. A process according to claim 1, wherein the polar dielectric material having piezoelectric properties is selected from the group consisting of polymer based, copolymer based and a polymer alloy.

7. A process according to claim 6, wherein the polar dielectric material is selected from the group consisting of copolymers of vinylidene polyfluoride and copolymers with tetraethylene and ethylene tetrafluoride.

8. Apparatus for manufacture of a product having piezoelectric properties as a result of dipolar orientation of an object having at least two opposed surfaces and made of polar dielectric material which material acquires said piezoelectric properties when subjected to an electric field of determined amplitude, said apparatus comprising:

means for exposing at least one surface zone of a first surface of the object to a jet of electrically charged droplets of a first polarity for at least a time sufficient for the charged droplets accumulating on said surface zone to increase a potential difference between said opposed surfaces up to said determined amplitude, wherein said means includes;

a high voltage D.C. source, generator means coupled to said high voltage D.C. source for emitting said charged droplets, said high voltage D.C. source charging said droplets emitted by said generator means to a first determined potential of said first polarity, said generator means located to face said surface zone, and conductive support means maintained at a second potential and engaged with another surface of said object.

9. Apparatus for manufacture of a product having piezoelectric properties as a result of dipolar orientation of an object having at least two opposed surfaces and made of polar dielectric material which material acquires said piezoelectric properties when subjected to an electric field of determined amplitude, said apparatus comprising:

means for exposing at least one surface zone of a first surface of the object to a jet of electrically charged droplets of a first polarity for at least a time sufficient for the charged droplets accumulating on said surface zone to increase a potential difference between said opposed surfaces up to said determined amplitude, wherein said means includes;

a high voltage D.C. source, generator means coupled to said high voltage D.C. source for emitting said charged droplets, said high voltage D.C. source charging said droplets emitted by said generator means to a first determined potential of said first polarity, said generator means located to face said surface zone of said first surface, means for bringing another surface of said object to a second determined potential, wherein said object has a film form and wherein said apparatus further comprises:

first and second film storing reels, means for unwinding said film from one said reel and winding the film onto another said reel so as to displace said film intermediate said reels in a determined direction, wherein said surface zone and said means for bringing are intermediate said first and second reels.

10. Apparatus as recited in claim 9, wherein the second determined potential is the potential of the earth and the conductive support means comprises a roller.

11. Apparatus as recited in claim 9, wherein the said conductive support means is a pressing skid.

12. Apparatus as recited in claim 9 wherein said means for brining comprises:

a second high voltage D.C. source, second generator means coupled to said second high voltage D.C. source for emitting charged droplets, said second high voltage D.C. source charging said droplets emitted by said second generator means to a second determined potential of polarity opposite to said first polarity, said second generator means located to face a surface zone of said another surface of said object.

13. Apparatus as recited in any of claims 10, 11, 9 or 12 and further including:

means for discharging a surface of said film facing said generator means, said means for discharging located downstream from said generator means with reference to said determined direction of displacement of said film.

14. Apparatus as recited in claim 13 wherein said means for discharging comprises supplementary generator means for emitting charged droplets, a supplementary D.C. voltage source coupled to said supplementary generator means for charging said droplets to a potential opposite in polarity to said first potential.

15. Apparatus as recited in claim 13, wherein the means for discharging comprise a tunnel for heating the film.

16. Apparatus as recited in claim 14 further comprising means for measuring residual charge of the film downstream from the means for discharging and means for controlling the said discharge relative to reference value.

17. Apparatus as recited in claim 16, and further comprising programmed means for deflecting the jet of charged droplets for directing said charged droplets in controlled directions so as to carry out a selective dipolar orientation of said film.

* * * * *

UNITED STATES PATENT AND TRADEMARK OFFICE
CERTIFICATE OF CORRECTION

PATENT NO. : 4,734,228

DATED : March 29, 1988

INVENTOR(S) : Francois Micheron, et al.

It is certified that error appears in the above-identified patent and that said Letters Patent is hereby corrected as shown below:

Column 1, line 20, change "tow" to --two--.

Column 1, line 61, change "electrid" to --electric--.

Column 1, line 68, change "killovolts" to --kilovolts--.

Column 2, line 16, after "causes" insert --chemical--.

Column 3, line 37, change "principle" to --principal--.

Column 3, line 39, after "A" insert --charged--.

Column 3, line 43, change "sapce" to --space--.

Column 4, line 22, change "inention" to --invention--.

Column 4, line 60, change "comparny" to --company--.

Column 5, line 30, change "it" to --its--.

Column 5, line 60, delete "to" (second occurrence).

Column 7, line 33, change "ar" to --are--.

Column 7, line 51, change "corrsponding" to --corresponding--.

UNITED STATES PATENT AND TRADEMARK OFFICE
CERTIFICATE OF CORRECTION

PATENT NO. : 4,734,228

DATED : March 29, 1988

INVENTOR(S) : Francois Micheron, et al

It is certified that error appears in the above-identified patent and that said Letters Patent is hereby corrected as shown below:

Column 10, line 9, change "brining" to --bringing--.

Column 10, line 37, after "and" insert --servo-control--.

Signed and Sealed this

Sixteenth Day of May, 1989

Attest:

DONALD J. QUIGG

Attesting Officer

Commissioner of Patents and Trademarks